United States Patent [19]

Kelly et al.

[11] Patent Number: 5,061,850
[45] Date of Patent: Oct. 29, 1991

[54] HIGH-REPETITION RATE POSITION SENSITIVE ATOM PROBE

[75] Inventors: Thomas F. Kelly, Madison; Jon J. McCarthy, Middleton; Derrick C. Mancini, Madison, all of Wis.

[73] Assignee: Wisconsin Alumni Research Foundation, Madison, Wis.

[21] Appl. No.: 560,616

[22] Filed: Jul. 30, 1990

[51] Int. Cl.$^5$ .................. H01J 37/285; H01J 49/40
[52] U.S. Cl. ................................. 250/306; 250/309; 250/423 F; 250/287
[58] Field of Search ..... 250/306, 307, 309, 423 F:286, 250/287, 288

[56] References Cited

U.S. PATENT DOCUMENTS

| | | | |
|---|---|---|---|
| 3,602,710 | 8/1971 | Mueller | 250/309 |
| 3,819,941 | 6/1974 | Carrico | 250/281 |
| 3,868,507 | 2/1975 | Panitz | 250/287 |

FOREIGN PATENT DOCUMENTS

WO8700682 1/1987 PCT Int'l Appl.

OTHER PUBLICATIONS

E. W. Muller, et al., "The Atom-Probe Field Ion Microscope," The Review of Scientific Instruments, vol. 39, No. 1, Jan. 1968, pp. 83–86.
J. A. Panitz, "The 10 cm Atom Probe," Review of Scientific Instruments, vol. 44, No. 8, Aug. 1973, pp. 1034–1038.
J. A. Panitz, "The Crystallographic Distribution of Field-Desorbed Species," J. Vac. Sci. Technology, vol. 11, No. 1, Jan./Feb. 1974, pp. 206–210.
E. W. Muller, et al., "Energy Deficits in Pulsed Field Evaporation and Deficit Compensated Atom-Probe Designs," Review of Scientific Instruments, vol. 45, No. 9, Sep. 1974, pp. 1053–1058.
C. Martin, et al., "Wedge-and -Strip Anodes for Centroid-Finding Position Sensitive Photon and Particle Detectors", : Rev. of Sci. Instruments, vol. 52, No. 7, Jul. 1981, pp. 1067–1074.
H. F. Liu, et al., "Numerical Calculation of the Temperature Evolution and Profile of the Field Ion Emitter in the Pulsed-Laser Time-of-Flight Atom Probe," Review of Scientific Instruments, vol. 55, No. 11, Nov. 1984, pp. 1779–1784.
T. J. Kinkus, et al., "Field Adsorption of Inert Gas Atoms on the Tungsten Surface-A Pulse-Laser Atom--Probe Study," Journal Vacuum Science Technology, vol. A3, No. 3, May/Jun. 1985, pp. 1521–1524.

(List continued on next page.)

Primary Examiner—Jack I. Berman
Attorney, Agent, or Firm—Foley & Lardner

[57] ABSTRACT

Atom probe apparatus includes an emission tip from which atoms can be evaporated in atomic emission events, a position sensitive detector for detecting the position and timing of the charge cloud resulting from atomic emission events, and a pulse heating beam for heating the emission tip in short pulses to evaporate atoms essentially one at a time from the emission tip. The heating beam may be formed as an electron beam from an electron gun which is directed to the tip and scanned rapidly back and forth across the tip to be incident upon the tip for short periods of time as the beam is scanned back and forth. The beam may further be produced as a chopped beam of electrons by scanning the beam back and forth across a slit in an aperture plate so that only pulses of electrons pass through the plate as the beam passes across the slit. The electrons passing through the slit are then focused and directed to the tip. The tip may also be heated by light from a pulsed source such as a laser which is passed through a reflecting Schwarzschild objective and focused onto the tip in pulses to provide excitation by light photons. The position sensitive detector, which may include a microchannel plate backed by a position sensitive wedge and strip detector, determines both the time of arrival of a charge pulse from an atomic emission event and the relative position of the charge cloud at the point where it impacts upon the detector. The detector may also be formed as a three-level, trigonal array of pads which allows both one and two atomic events per heating pulse to be resolved.

24 Claims, 9 Drawing Sheets

OTHER PUBLICATIONS

H. G. Liu, et al., "Numerical Calculation of the Temperature Distribution and Evolution of the Field-Ion Emitter Under Pulse and Continuous-Wave Laser Irradiation," Journal Applied Physics, vol. 59, No. 4, Feb. 1986, pp. 1334-1340.

A. Cerezo, et al., "Development and Initial Application of a Position-Sensitive Atom Probe," Journal de Physique, Colloque C6, Supplement au No. 11, Tome 49, Nov. 1988, pp. C6-25 to C6-30.

W. Wetherell, et al., "General Analysis of Aplantic Cassegrain, Gregorian, and Schwarzschild Telescopes," Applied Optics, vol. 11, No. 12, Dec. 1972, pp. 2817-2832.

I. Louas, et al., "Design and Assembly of a High Resolution Schwarzschild Microscope for Soft X-Ray Optics," SPIE, vol. 316, High Resolution Soft X-Ray Optics, 1981, pp. 90-96.

D. L. Shealy, "Development of a Normal Incidence Multilayer Imaging X-Ray Microscope," SPIE, vol. 1160, X-Ray/EUV Optics for Astronomy and Microscopy, 1989, pp. 109-121.

K. Barnes, et al., "Beam Delivery Via the Reflecting Objective," Photonics Spectra, May 1990, pp. 105-109.

HIGH-REPETITION RATE POSITION SENSITIVE ATOM PROBE

FIELD OF THE INVENTION

This invention pertains generally to the field of microscopy and particularly to position sensitive atom probes.

BACKGROUND OF THE INVENTION

The field-emission microscope (FEM) was invented by Muller in 1936. In that instrument, an image was formed by applying a high voltage (about 5 kV) between a flat plate detector (fluorescent screen) and a field-emission tip which served as the cathode. Electrons were emitted from the tip by the field-emission process and followed the simple field lines to the anode. This process produces a high-magnification (1 million times) image of the emission region of the tip on the imaging screen. The image resolution is better than 1 nm.

In 1951, Muller introduced the field-ion microscope (FIM). The tip in this instrument is the anode and an imaging gas (hydrogen, or an inert gas) is introduced into the system at low pressure ($10^{-3}$ Pa). The principle is similar to FEM but ionized gas species produce the image at the screen. The FIM has the advantage that the image is much brighter on a fluorescent screen. In the 1960's, this instrument was applied to structural studies of metals.

In 1967, Muller, et al., introduced the atom probe field-ion microscope (AP/FIM). In this instrument, the imaging gas is removed and, with the tip operating as an anode, the field is increased to the point where the atoms on the surface are evaporated by the field. Since the process of field evaporation involves ionization of the atoms, they are accelerated to the imaging screen by the applied field. An aperture with a virtual size of 0.5 to 5 nm is placed in the image screen to allow the ions from a specific location on the tip to pass though into a time-of-flight mass spectrometer.

Since time-of-flight information is used to identify the atom, it is necessary to know when it leaves the tip. This is usually accomplished by keeping the applied field low enough that negligible evaporation occurs and then superimposing a very short (in temporal duration) pulse on the high voltage (about 15% overvoltage). The field during the pulse must be high enough to cause evaporation of a specified small number of atoms (0.01 to 10).

Mass resolution in a time-of-flight atom probe varies with the mass of the atom. A typical atom probe which uses pulsing of the field achieves a mass resolution of 1 part in 200 for molybdenum. At this mass resolution, it is not possible to distinguish all of the medium to heavy isotopes in a given material. One approach which overcomes this difficulty is the use of an energy-compensating filter which improves the mass resolution to about 1 in 2000 for molybdenum. Two common energy compensating systems are the poschenreider lens and the reflectron. At mass resolutions of 1 in 2000, it is possible to resolve virtually any isotope except those that have identical mass to charge ratios like $N^{2+}$ and $Si^{1+}$.

For conventional atom-probe operation, this filter is highly desirable. It has the further advantage that atom-probe studies can be performed with imaging gases present (because the gas ions can be filtered out of the data). This means that high quality FIM images are available during probing. Though such a system is large and complex, it has been used on a commercially available atom probe made by Vacuum Generators of England.

A microchannel plate (MCP) detector which has been used in AP/FIM multiplies the signal produced by ions or electrons at any point in a planar or curved array. It has an adjustable high gain and low noise. This detector produces robust images in FIM mode and it made possible detection of individual ions. Furthermore, when the ions arrive, a signal is produced which can be used for timing.

In 1973, Panitz, Rev. Sci. Instrum. 44, p. 1034 et seq., described an atom probe which measured the time of flight of individual ions from the tip to any point on a detector (image) plane. Though any location on the image plane could be monitored at any time this system did not have true parallel detection. However, the detection system could be used for both imaging and for measuring time of flight. Imaging atom probes (IAP) evolved from this concept. By selectively turning on, or gating, the microchannel plate detector for short periods of time when ions of a selected species are expected to arrive, it is possible to produce an image due only to that species.

In the late 1970's, Tsong, Surf. Sci., Vol. 70, 1978, p. 211, and Kellogg and Tsong, J. Appl. Phys. 51, 1980, pp. 1184 et seq., described the use and advantages of thermal excitation by a pulsed laser for inducing field evaporation. They showed that the field required to induce a given evaporation rate (0.5 monolayers per second) is inversely related to the temperature of the tip. By holding the field just below the critical evaporation field and then heating with a short (7 ns) laser pulse, they were able to induce controlled evaporation in a pulsed mode. The major advantage of this approach is that the applied field is constant during the pulse. This obviates the need for a Poschenreider lens. If the thermal transient is short, then the time during which the ion may leave the tip is determined with high precision. Kellogg and Tsong achieved a mass resolution of about 1 in 100 at molybdenum with the laser that they employed. A mass resolution of about 1 in 3000 at tungsten (about 1 in 2000 at molybdenum) has been shown to be achievable with this pulsed-laser atom probe (PLAP).

A parallel detection scheme has been applied to the atom probe by a group at Oxford University, as described in Patent Cooperation Treaty Application PCT/GB86/00437, publication No. W087/00682, and A. Cerezo, et al., Rev. Sci. Instrum. 59 (1988) p. 862 et seq. A parallel detector for an atom probe must determine two pieces of information: a) the identity and b) the location on the tip of each atom (ion) that is evaporated from the tip. The Oxford group used a wedge and strip (WSA) detector at the output of the microchannel plates. See E. Martin, et al., Rev. Sci. Instrum. 52 (1981), pp. 1067 et seq. The atom's identity is determined by the time of flight from the tip to the microchannel plate. The location of the atom on the tip is determined from the position where the charge cloud hits the WSA. Using voltage-pulsing, the Oxford group has produced position sensitive atom probe (POSAP) images wherein several phases present on a nanometer scale are apparent and their composition is determined exactly. The addition of a parallel detector to the atom probe thus changes the output of an atom probe from a linear composition profile to a volume composition image.

While the benefits of POSAP for microanalysis on the atomic scale are clear, current instrumentation suffers from several limitations. The most notable drawbacks are the low data collection rate (system throughput) and relatively low mass resolution.

The limits on the ion count rate in the current POSAP stem from the nature of the detector and the frequency of the desorption pulses. Like most position-sensitive detectors, the wedge-and-strip detector is a serial counting device. This means that there is a time constant associated with detecting and processing each ion event. If a second ion arrives at the detector during the time that the first is being processed (of the order of the time constant), then the charge from the two events will be summed and the reported position will be inaccurate. The rate of data acquisition is therefore restricted by the requirement that the probability that two atoms evaporate per pulse becomes negligible only when the probability that one atom evaporates per pulse is on the order of 0.01–0.03. There is also a conversion time for the pulse-processing electronics described below, the time constant for which is on the order of 300 ns for the detector followed by a 60 μs conversion time for the analog-to-digital conversion (ADC). This suggests a maximum pulsing rate of 1 per 60 μs or about 2 $\times$ $10^4$ per second. Since one in 50 pulses produces an ion, and the ADC can be cleared in approximately 2 μs during a null event, the ion counting rate can actually be determined by 50 null events plus one detection per ion, which is 160 μs per ion or 6 $\times$ $10^3$ ions per second.

Because the field is changing during the rise and fall of a high-voltage pulse, the energy of a departing ion will depend on when during the pulse the ion leaves. This spread in energy of the ions translates directly into a spread in the flight times of ions and the corresponding mass resolution is decreased. To prevent excessive spreads in the ion energy, the high voltage pulse applied to the tip must have a sub-nanosecond rise time. The techniques for providing these pulses are limited, and can only provide frequencies in the 100 to 250 Hz range. The pulsed-field position-sensitive atom probe (PFPOSAP) can therefore be pulsed no faster than about 250 Hz. At one atom per 50 pluses, this translates into a data collection rate of about 5 atoms per second. Thus, the speed of the PFPOSAP is limited by the pulsing since the detection process can run about $10^3$ times faster. A typical FIM image is about 100 atoms across. To collect an image which is 100 atoms on a side by 100 atoms deep (20 nm)$^3$, it takes about 30 to 50 hours. Clearly then, it is desirable that the pulse rate be more closely matched to the throughput of the detector system to speed up the POSAP.

This throughput limitation can be overcome by using an alternative method to desorb ions from the tip: heating the tip several hundred Kelvin with a short pulse of energy. The advantages of pulsed evaporation by thermal assist are manifold and clear. They have largely bern elucidated by work on the pulsed-laser atom probe (PLAP). However, though pulsed lasers have been used with good success, they have yet to be applied at high repetition rate in short-flight-path instruments like POSAP. See G.T.L. Kellogg, et al., J. Appl. Phys. 51 (1980) pp. 1184 et seq.; T. T. Tsong, et al., Rev. Sci. Instrum. 53 (1982) pp. 1442 et seq.; W. Drachel, et al., Int. J. Mass. Spectrom. Ion Phys. 32 (1980), pp. 333 et seq.; A. Cerezo, et al., J. of Microscopy 141 (1986), pp. 155 et seq.; A. Cerezo, et al., J. Phys. (Orsay) C9 (1984) C9, pp. 315 et seq.

A high pulsing speed is physically possible but it will not be useful unless the detection system can operate at comparable speeds. Typical position-sensitive detector systems are only capable of detecting about 6 $\times$ $10^3$ events per second. Two basic types of position-sensitive detector exist: a) those based on charge separation, and b) those based on a binary signal (hit or not). Charge separation on electrodes gives good position information but is limited in speed by the charge integration electronics. Furthermore, the detectors generally handle only one event at a time. The binary-result detectors can be high speed and can handle simultaneous events, however, the precision of the binary-result detectors can be no better than the wire spacing. There is also the problem of determining the position when several adjacent wires are hit.

SUMMARY OF THE INVENTION

In accordance with the present invention, high-speed thermal pulsing is obtained in a first manner by directing an electron beam to the sample tip to deposit the smallest amount of energy necessary to heat the first several atomic layers on the tip to the desired temperature in the desired time. As the amount of energy deposited decreases, the heating and cooling rates increase, and the pulse duration decreases, improving the mass resolution. By heating the tip with an electron beam in accordance with the present invention, it is possible to focus the beam to a very small beam probe diameter and direct it to specific locations on the sample tip.

In a preferred implementation of the present invention, a pulsed electron beam is provided by an electron gun having, for example, an emitter, either thermionic or field emission, a condenser lens, a set of beam deflectors for pulse generation, an aperture or slit for pulse generation which may be variable in size, a condenser aperture which may be variable in size, a second condenser lens, deflectors for scanning the beam, and stigmators for adjusting for astigmatism. The beam is aligned to hit the tip, preferably by rastering the beam across the area of the tip while operating the atom probe apparatus, and observing the signal on the scanned image. The amplitude of the evaporation rate, as detected by a detector having a microchannel detector plate, can then indicate at what point in the raster the beam has hit the tip. The image can be displayed as an intensity modulation or as a Y modulated rastered image on a raster CRT monitor. A DC offset may be applied to the scan coils to bring the bright feature (i.e., the tip) to the center of the raster. The raster size can then be reduced to increase the magnification of the image until the beam can readily be located at the very tip. By adjusting the focus on the second condenser lens, the beam can be focused onto the tip and the maximum brightness then corresponds to the optimal focus. Successively finer rasters may be used to achieve the best location of the maximum in the evaporation rate. The point in the raster at which the maximum in the evaporation rate occurs corresponds to the best trajectory for electron beam heating of the tip. Alternatively, this optimal location and focus can be found by manual or automated adjustment of the deflectors.

After the location of the optimal trajectory is established, adjustment of the power in the beam can be made. The first condenser lens is set to focus the beam onto slits or aperture. The slit or aperture can be variable in size if desired. The pulse-generation deflectors raster the beam back and forth across the slit and produce a pulsed or chopped beam. The amount of power in the beam can then readily be controlled by variation of the fraction of time that the beam passes through the slit. When a scanned image is used, the pulses are preferably short enough that several pulses arrive during the time that one pixel is recorded on the CRT monitor. It is not necessary that the beam always be pulsed. However, the change from a continuous beam to a pulsed beam is large enough that small shifts in alignment could occur. Instead, if the beam is always pulsed, once optimal focus and location are determined, the only adjustment necessary is in the "on" time of the beam.

When scanning at low magnifications, the beam may be defocused so that there is overlapping of the scan lines in the raster at the plane of the tip to allow the location of the tip to be determined at each raster.

The position of the electron beam optical column which provides the electron beam to the tip can be varied with respect to the access of the tip and detector from an angle of 0° to over 90°. At an angle of 90° and also possibly at angles greater than 90° with respect to the axis, the electrons impinging on the tip will tend to excite the smallest possible volume. It is also possible to fit a detector for transmitted electrons to the system so that scanning transmission electron microscopic images may be obtained while operating the atom probe. Furthermore, electron diffraction patterns may be obtained from the sample in this orientation.

Transmission electron microscopes (TEM) and scanning transmission electron microscopes (STEM) can be modified to accept an atom probe in accordance with the present invention, and advantageously utilizing the electron beam column and the detectors of the microscopes as components of the apparatus of the present invention.

Pulsed heating may also be achieved by scanning a continuous beam across the tip if the beam is scanned sufficiently rapidly.

The electron beam excitation in accordance with the present invention has the particular advantage that it has very small excitation volume. Further, the electron thermal excitation beam may be utilized as an electron microscopy beam to provide STEM data concerning the sample tip.

An alternative tip heating system of the invention utilizes a pulsed laser in combination with two spherical reflectors forming a Schwarzschild objective, which focuses the light from the laser onto the tip. This objective is totally reflective, and thus achromatic, and may be used with a wide range of laser wavelengths as well as light from other sources. This objective is very compact and may be placed near the object, in this case, the tip, while the source can remain a large distance from the objective.

A variety of detectors may be used in the position sensitive pulsed atom probe of the present invention. A novel detector which may be incorporated in the atom probe utilizes a three-level, trigonal array of pads which allows both one and two atomic events per heating pulse to be resolved.

Further objects, features and advantages of the invention will be apparent from the following detailed description when taken in conjunction with the accompanying drawings.

DETAILED DESCRIPTION OF THE INVENTION

Figure 1:
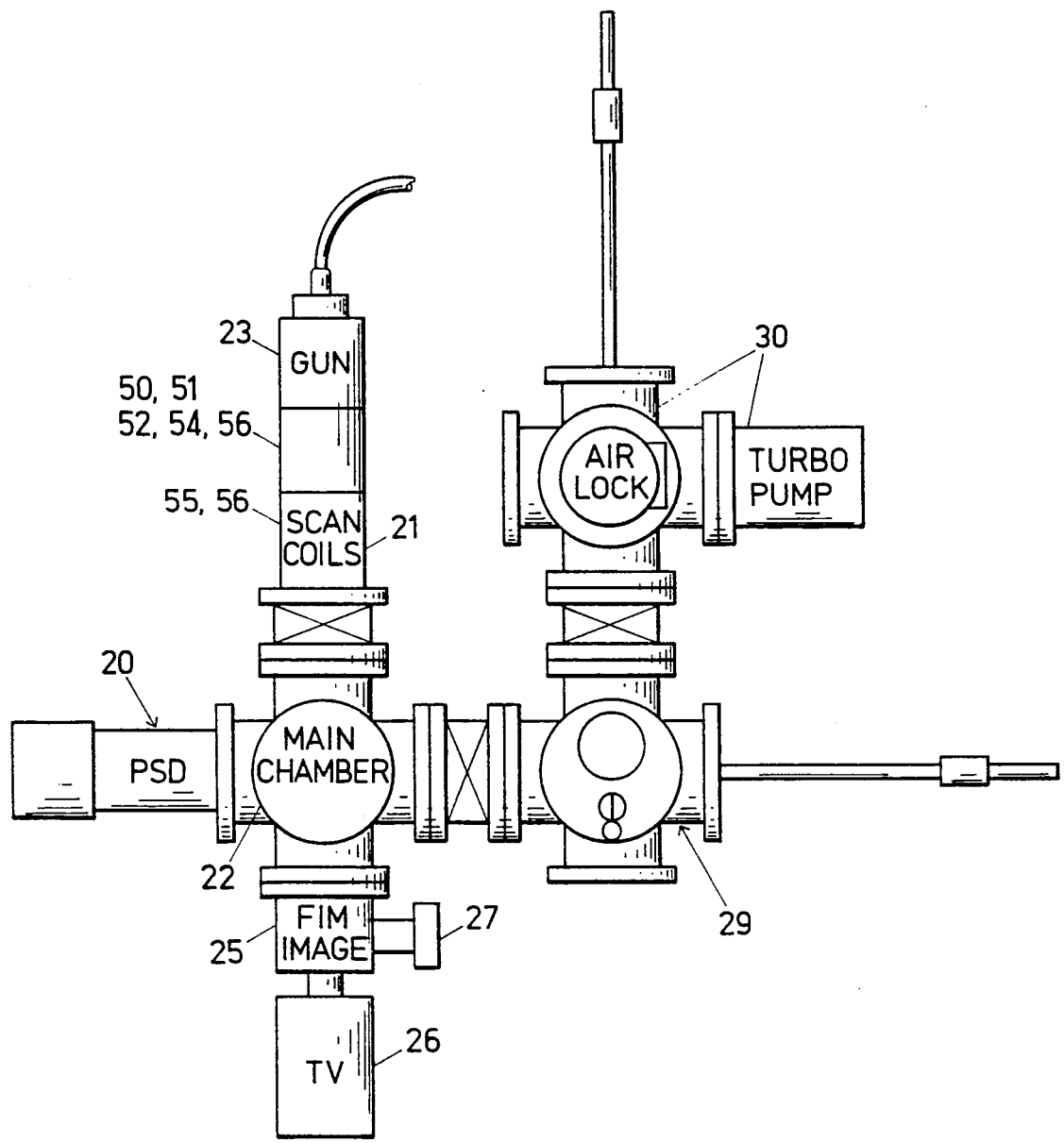
FIG. 1 is an illustrative front view of a pulsed electron beam atom probe in accordance with the present invention showing the major components thereof.

With reference to the drawings, an illustrative view of the physical layout of the atom probe instrument in accordance with the present invention is shown generally in FIG. 1 with the position sensitive dector system shown at 20. The atom probe has a main chamber 22 which encloses a portion of the atom probe, an electron optical column 22 with an electron gun 23 and a field ion microscope (FIM) imager 25 with associated read out devices such as a television camera 26 or photographic camera 27. Ancillary equipment includes an ultra-high vacuum sample preparation chamber 29 and a turbo pump and air lock 30. Pumping is preferably designed so that ultra-high vacuum can be achieved with oil free pumps and without vibration. The main chamber preferably includes ports for the position sensitive atom probe detector, a standard imaging detector 25 for field ion microscopy images, and the electron optical column 21 which may serve also as a scanning transmission electron microscope (STEM) column. The transmitted electron intensity from the STEM column can be detected on the microchannel plate of the FIM detector. Electron diffraction patterns may also be images by the FIM detector.

The ultra-high vacuum sample preparation chamber 29 allows sample preparation such as deposition, heating and sputtering to be performed in this chamber. Studies such as interdiffusion of thin films on substrates can be performed in the atom probe chamber after deposition and annealing. Tips may also be ion milled to sharpen them. A second important function of the sample preparation chamber is to serve as a vacuum buffer between an introduction chamber and the main chamber. An air lock mounted on the top of the sample preparation chamber is pumped by a turbo pump backed by a molecular drag pump to allow pressures in the $10^{-3}$ to $10^{-17}$ Pa range to be achieved in the air lock. The main chamber in the sample preparation chambers may be pumped by a combination of titanium sublimation pumps and ion pumps. A turbo pump can be used on the main chamber to rough out both chambers and to remove imaging gas which is introduced during FIM imaging. The main chamber and the sample preparation chamber are preferably separated with a gate valve so that each is an independent ultra-high vacuum system.

Figure 2:
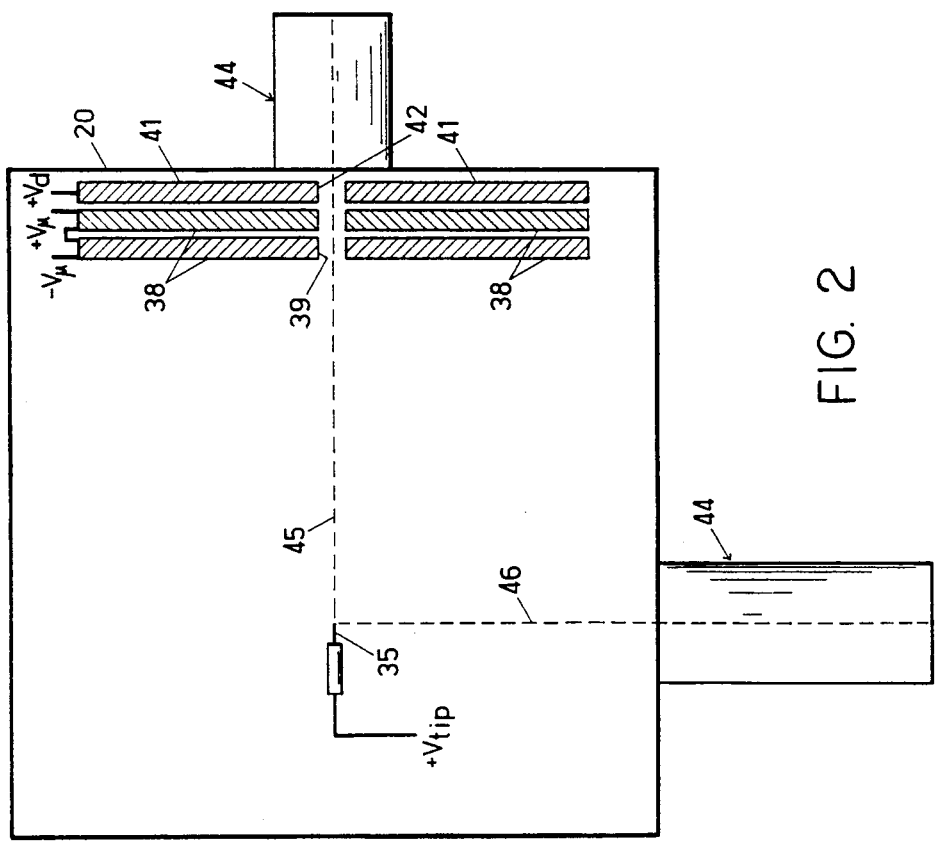
FIG. 2 is a schematic illustration of the mounting positions of the electron optical column with respect to a sample tip and detector in the atom probe of the present invention.

A highly simplified illustrative view through the main sample chamber is shown in FIG. 2, illustrating the positioning of the sample tip 35 with respect to the microchannel plate 38 having an aperture 39, and a position sensitive detector 41 having an aperture 42 aligned with the aperture 39. As explained further below, the electron-beam-generating optical column 44 may be mounted at various orientations with respect to the axis 45 which extends from the tip 35 to the channel plate 38 and detector 41. In a first orientation illustrated in FIG. 2, the column 44 is aligned with the axis 45. In a second arrangement, the electron optical column 44 is mounted along an axis 46 which is at an angle of 90° with respect to the axis 45 of the tip and the detector. The electron column can also be mounted at other angles which are intermediate between 0° and 90° or greater than 90°.

Figure 3:
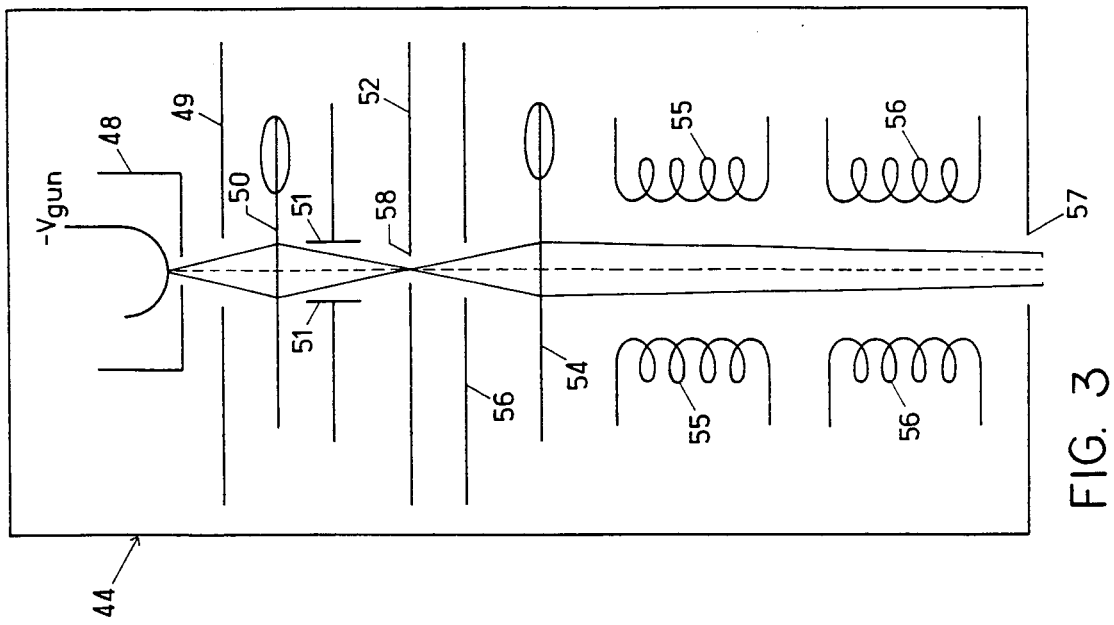
FIG. 3 is a schematic illustration of an exemplary electron optical column which may be utilized in the atom probe.

A schematic illustration of a preferred arrangement for the electron beam column 44 is shown in FIG. 3. An electron gun 48, which may be a thermionic emission or field emission gun, provides a spray of electrons which passes through the aperture of a grounded plate 49 to a condenser lens 50 and then through pulse-generating deflectors 51, a slit or aperture plate 52 which blocks electrons except at slit or slits 58 formed therein, a condenser aperture 53, a condenser lens 54, scanning deflectors 55, and stigmators 56, before passing through the outlet aperture 57.

To obtain the necessary high throughput and improve mass resolution, it is desirable that the electron beam source provide a pulse width less than 2 nanoseconds (ns) with a repetition rate of at least 20 kHz. In addition, the rise time of the pulses should be as fast as possible. In one embodiment of the present invention, the short time duration pulses needed are provided by static deflection of the electron beam across a narrow slit or slits 58 in the aperture plate 52 as illustrated in FIG. 3. A beam of ten microns diameter can be scanned across a one micron slit to produce a $10^{-10}$ second pulse. To deposit on the order of $10^{18}$ watts/m$^3$ during that pulse, it is necessary to have a 250 nanoamp beam current at 10 kV. The electron gun 48 can be a commercially available gun (e.g., Perkin Elmer Model 06-110 or an FEI Corporation electron optical column of which there are several possibilities) with the customized deflection system shown in FIG. 3. The PERKIN ELMER electron gun may be operated normally in the range of 0.5 to 5 kV, and can supply up to 2 microamps in a 10 micron spot. Such commercially available guns come with integral electrostatic focusing and deflection plates and are ultra-high vacuum compatible. The working distance of the objective is variable from 5 to 50 mm. The electrostatic quadrupole deflection system of the Perkin Elmer gun has a raster size of ± 1 mm at 16 mm working distance with a nominal scan voltage in the range of ± 100 volts.

The slit plate 52 having approximately a 1 micron slit or aperture 58 is in a grounded holder at a preferred focal distance (e.g., 16 mm) from the electron gun 48. With a spot size of 10 microns, the spot can be swept across the slit at $1 \times 10^4$ m/s ($6 \times 10^7$ radians/s at 16 mm) to obtain a 1 nanosecond pulse. Commercially available pulsers (e.g., from Avtec Corporation) can be utilized to provide the required deflection to the X and Y deflection plates 51. One pulser may be used to deflect in the X direction across the slit and the second can deflect in the Y direction to steer the beam above the slit during the return scan in the X direction. The smallest possible slit is desirable, preferably a 1 micron by 1 millimeter slit, with larger slits (e.g., 5 microns wide) usable if the scan system is sufficiently fast.

Figure 5A:
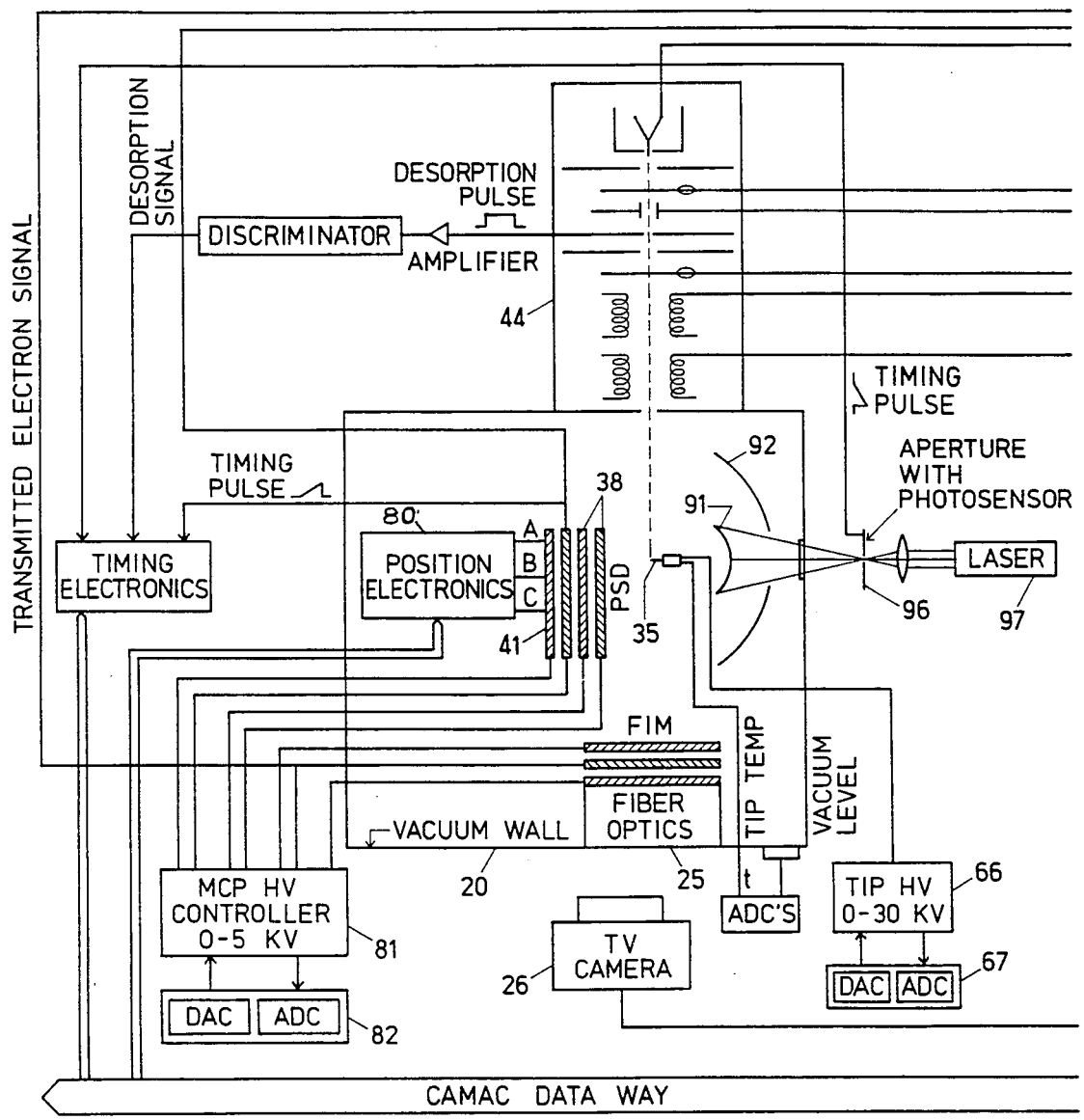
FIG. 5A and 5B are a schematic block diagram of the electronic control system for the pulsed electron beam atom probe.
Figure 5B:
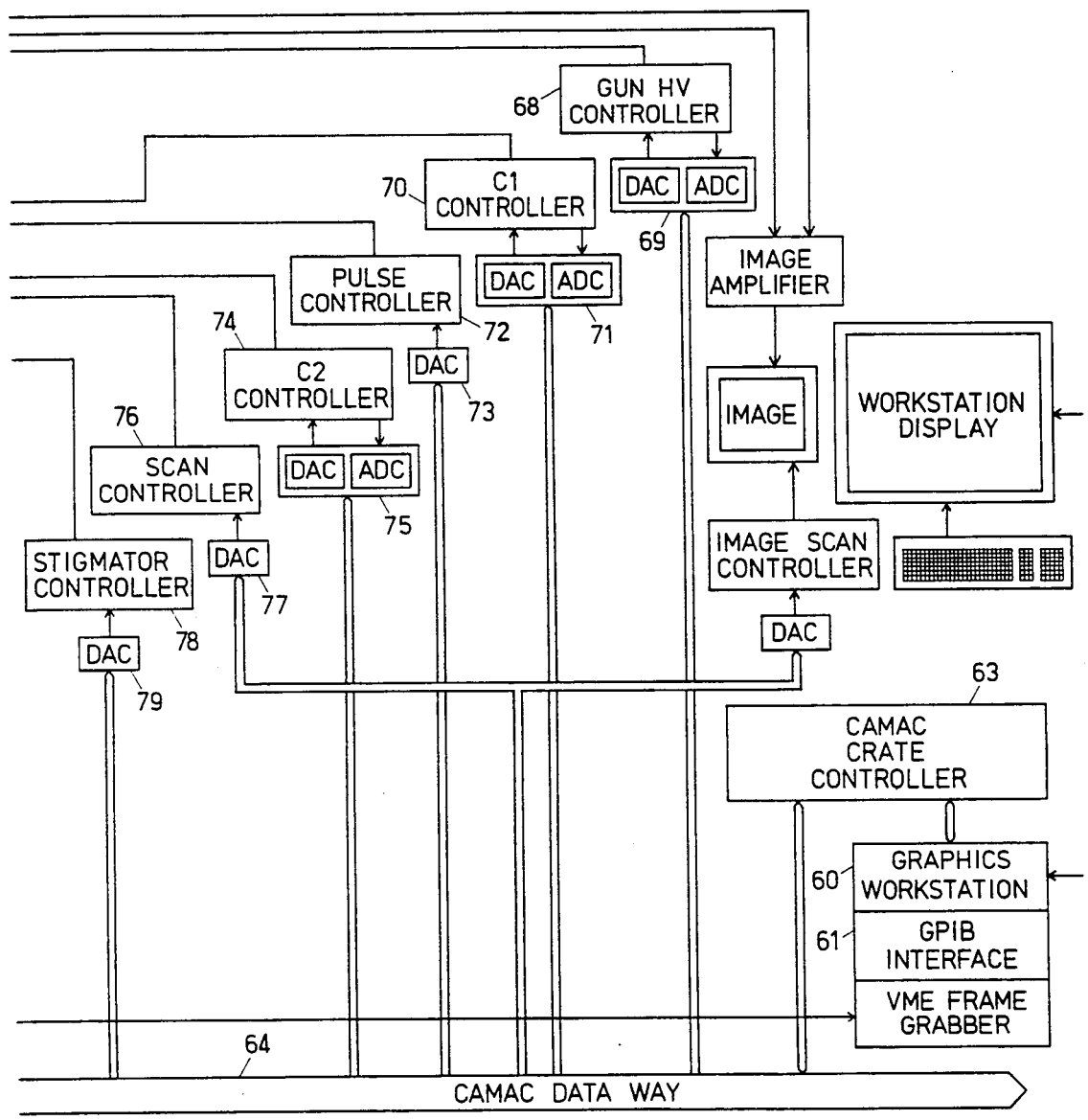

A schematic block diagram of the electronic control system for the probe is shown in FIG. 5, Control and monitoring of the system is performed by a work station 60 via a GPIB interface 61 to a standard CAMAC system which includes a crate controller 63 and a data way 64. The voltage on the tip is controlled by a supply 66 which receives control signals from the data way and is monitored through a digital-to-analog converter (DAC) and analog-to-digital (ADC) unit 67. The electron gun in the beam generating column 44 receives high voltage from a controller 68 controlled from the dataway 64 through a DAC/ADC unit 69. The first condenser lens 70 is controlled by a controller 72 controlled from the dataway 64 through a DAC 73, the second condenser lens 54 is controlled by a controller 74 under control of data from a dataway through a DAC/ADC unit 75, the scanning deflectors 55 receive power from a scan controller 76 with control provided from the dataway through a DAC 77, and the stigmators 56 received power from a controller 78 under control of a DAC 79 connected to the dataway 65. The MCP 38 receives appropriate high voltages through a high voltage controller 81 and DAC/ADC unit 82. The output of the detector 41 is provided to detector electronics 77, which may be of conventional design, which provides its output to the data way 64. The tip 35 may also be heated by a laser 97, either separately or in combination with the electron beam column 44, using optics discussed further below.

Figure 6:
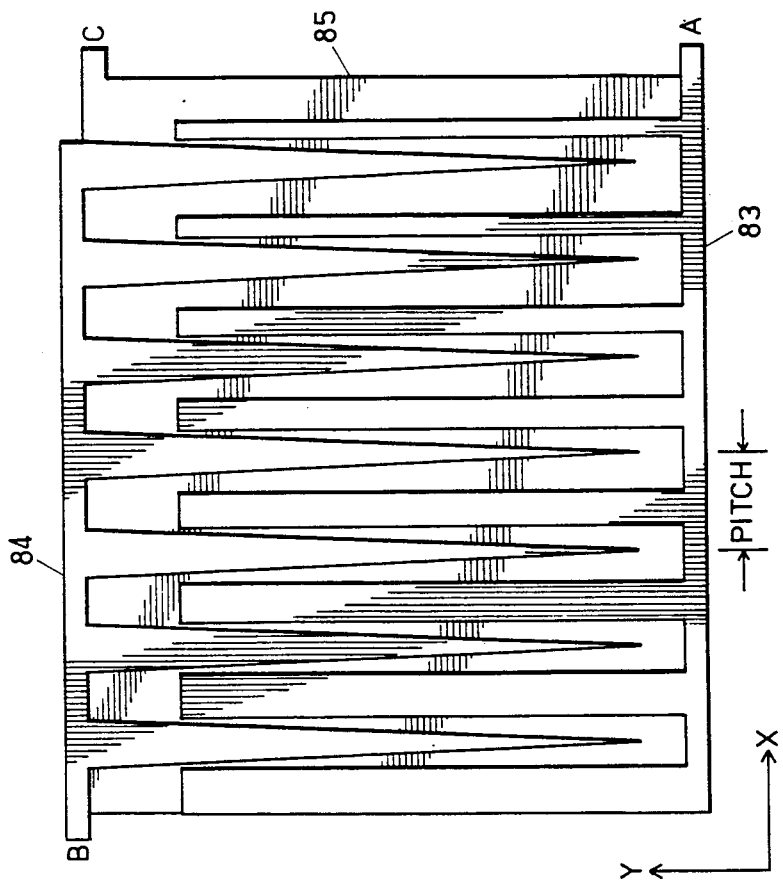
FIG. 6 is a schematic plan view of a wedge and strip detector which may be used in the atom probe of the invention.

A basic design of the position sensitive detector is also shown in FIG. 5. The assembly consists of a stack (2 or more) of microchannel plates (MCP's) 38 (such as is available from Galileo Electro-Optics Corporation) mounted in chevron configuration about 100 mm from the specimen tip 35. The MCP stack is preferably curved with a radius equal to the distance from the tip. The wedge-and-strip anode 41 which provides the position sensing is mounted at an appropriate distance (on the order of 10 mm) behind the MCP stack to match the electrode spacing to the size of the incident charge cloud to eliminate distortion in the image. These anodes are relatively easy to fabricate and exhibit little geometric distortion and high spatial resolution. For MCP outputs in the range of $10^{6-10^7}$ electrons, amplifier noise is less than $10^3$ electrons and images of $10^{5-10^7}$ pixels can be obtained. A resolution of better than 50 μm at a gain of $3 \times 10^6$ has been measured. This yields $500 \times 500$ pixels for a 25 mm MCP. A particularly simple coplanar three-electrode pattern for a position sensitive anode is shown in FIG. 6. In this configuration, charge signals are collected from the A, B, and C electrodes 83, 84, and 85, respectively, and are digitized. The position of impact of the incident ion can be calculated by the formulas:

$$X = \frac{2Q_A}{(Q_A + Q_B + Q_C)}$$

$$X = \frac{2Q_A}{(Q_A + Q_B + Q_C)}$$

where $Q_A$, $Q_B$, and $Q_C$ are the charges collected from each electrode.

The signals from the detector are amplified and digitized by a charge-integrating ADC (e.g., LeCroy 2249A). The output pulse from the MCP is amplified, shaped and discriminated in the detector electronics to provide a timing pulse to gate the input to the charge ADC and to the START input of a time-to-digital converter (TDC) (e.g., LeCroy 4208). The gate to the ADC is delayed (LeCroy 2323 gate/delay module) to account for the charging time of the charge-sensitive preamplifiers on the WSA electrodes. A second timing pulse is derived from amplifying and discriminating the signal from the pulsed-electron-beam source. This signal then goes directly to the TDC to trigger the STOP function. It is also used to gate the discriminator in the Start/Charge ADC channel to determine the time period for acceptance of valid ion events. All these modules are contained in the same CAMAC crate as the control modules for the rest of the instrument.

During an analysis, ion time-of-flight is determined by the TDC by measuring the interval between the desorption pulse and the arrival of an ion at the detector, as indicated by the signal from the MCP output. The TDC digitizes this interval to an accuracy of 1 ns.

Figure 4A:
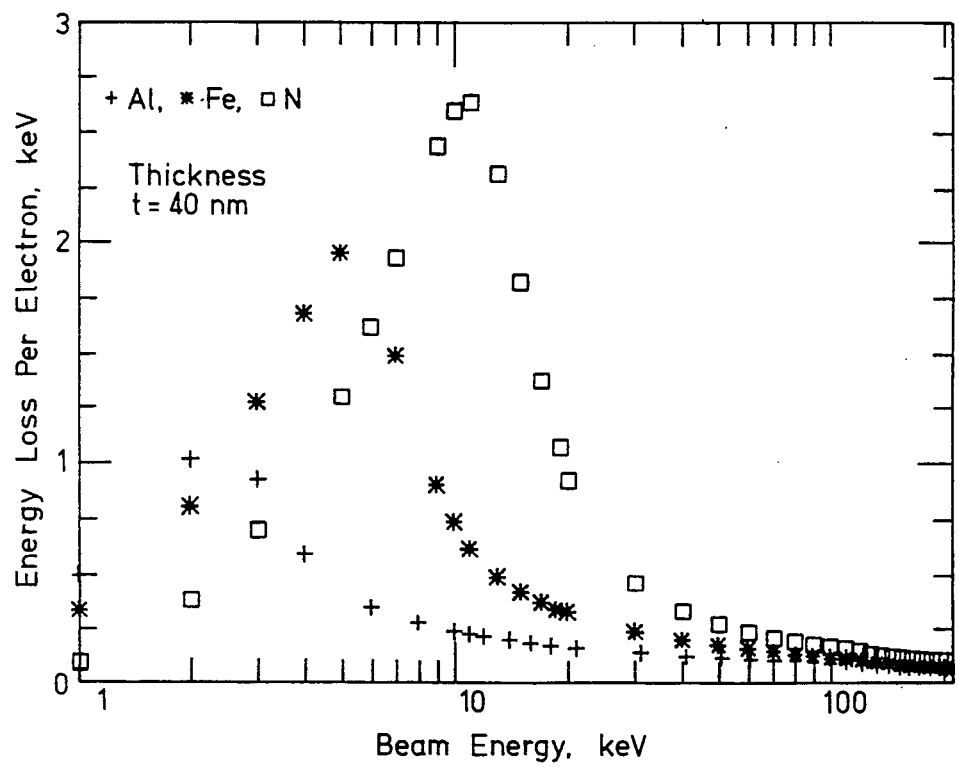
FIG. 4A and 4B are graphs showing the variation of energy deposition per incident beam electron with electron energy for a) aluminum, iron, and tungsten at 40 nm thick and b) for iron at 40, 100, and 200 nm thick.
Figure 4B:
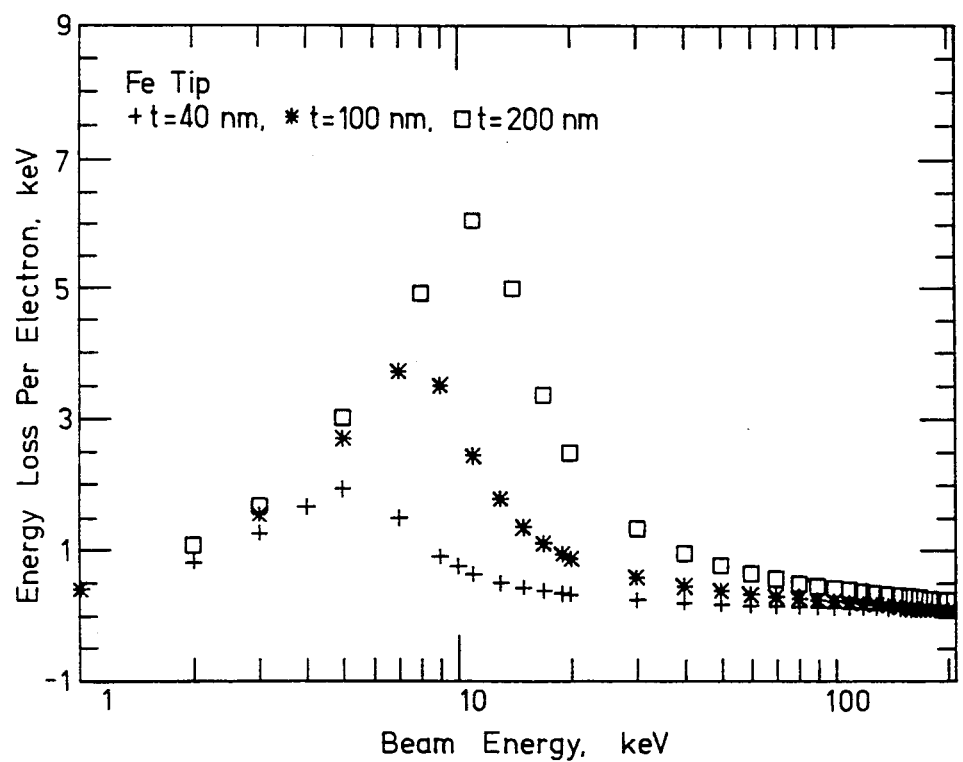

Referring again to FIG. 2, it is noted that since the heating of the tip must occur while the high field is applied to the tip, the acceleration of the beam electrons by the field must be taken into account. It is possible to use the fact that the tip is held at a high positive voltage relative to ground to accelerate the electrons toward the tip. Thus, low energy electrons (from 1 to 5 keV) may be produced by the electron column and they will be accelerated by the potential difference between ground and the tip as shown in FIG. 2. The electrons will arrive at the tip with an energy equal to e ($V_{gun}$ + $V_{tip}$). Because typical operating voltages for an atom probe are between 5 and 15 kV, the electron energy at the tip will be approximately 6 to 20 keV. This energy range corresponds to the maximum in the energy deposited per electron versus electron energy for sample thicknesses on the order of 100 nanometers, as illustrated in FIG. 4. which shows the variation of energy deposited per insident beam electron with electron energy for a) sample tips formed of aluminum, iron, and tungsten at 40 nm thick (FIG. 4a) and b) sample tips of iron at 40, 100, and 200 nm thick.

Alignment must be provided to the electron beam to ensure that the electrons will hit the tip where they are needed to obtain proper heating. Various signals may be used to guide alignment, including the absorbed current on the tip, the transmitted or backscattered electron current, and the rate of desorption of atoms from the tip. Of these, the last is the only one which is a maximum at the optimum focus condition. For the present purposes, optimum focus is defined as that condition which produces the maximum temperature rise at the tip region.

Using the evaporation rate as a signal for producing a scanned image, and with the electron beam prevented from hitting the tip, the applied high voltage on the tip ($V_{tip}$) can be increased until the evaporation rate becomes detectable. At very low evaporation rates, there may be isolated events and the raster image would appear as if it had random noise. As the evaporation rate increases, this random process becomes a steady stream and the raster image becomes an even intensity which increases with the increases in the electric field. At this point the field may be lowered (about 10%) until the evaporation just stops and the image is dark. The time of flight of the desorbed species in this mode need not be determined. The thermal excursion caused by impingement of the electron beam will result in a momentary increase in the evaporation rate only when the very tip is heated by the beam. By creating a raster of the beam which will cover a large enough area so that the trajectories will hit the tip somewhere in the raster, the tip will surely be heated at the point in the scan where the beam hits it. With the beam scanning (and thus, heating the tip in pulses) an image may be formed using the amplitude of the evaporation rate as detected on the anode. Such an image can be displayed as an intensity modulation or as a Y-modulated raster image on a rastered CRT monitor. A DC offset can be applied to the scan coils 55 (both X and Y coils) to bring the bright feature (i.e., the tip) to the center of the raster. The raster size may be reduced to increase the magnification of the image until the beam can readily be located at the very tip. By adjusting the focus on the second condenser lens 54, the beam may be focused onto the tip and the maximum in brightness then corresponds to the optimal focus. Successively finer rasters can be used to achieve the best location of the maximum in the evaporation rate. The point in the raster at which the maximum in the evaporation rate occurs corresponds to the best trajectory for electron beam heating of the tip. Alternatively, this optimal location in focus may be found by manual or automated adjustment of the deflectors, if desired.

After the location of optimal trajectory is established, adjustment of the power in the beam can be made. The first condenser lens 50 is then set to focus the beam onto the slit or aperture 58. The slit or aperture 58 can be variable in size, although it is not necessary. The pulse-generation deflectors 51 raster the beam back and forth across the slit and produce a pulsed or chopped beam. The amount of power in the beam can then be readily controlled by variation of the fraction of time that the beam is passing through the slits.

Where a scanned image is used, the pulses should be short enough that several pulses arrive during the time that one pixel is recorded. If a 256 × 256 image is used at 5 images per second, then there will be $3 \times 10^5$ pixels per second or 3 microseconds per pixels. Thus, one microsecond per pixel or 1 million pulses per second will work satisfactorily for the alignment mode. By varying the "on" time between $10^{-10}$ to $10^{-7}$ seconds, a variation of three orders of magnitude of beam power is available. Once the optimum focus and location are found, the excitation of the scan coils would be set to correspond to the optimal location. It is not necessary that the beam always be pulsed. However, the change from a continuous beam to a pulsed beam can be made after the optimum focus and location are found. The only adjustment that remains is in the power or "on" time of the beam.

Because the tip is relatively small, the beam needs to cover the entire area of the raster. However, a probe beam which is focused to its smallest size and then scanned in a raster will consist of separated narrow lines if the beam diameter is smaller than the distances between scan lines. Thus, when scanning at low magnifications, the beam may be defocused so that there is just overlap of the scan lines at the plane of the tip. If the beam is defocused, the power density will be diminished and consequently the amount of thermal excursion at the tip will be less. However, this does not present a difficulty in the locating mode operation.

As noted above, a detector 25 for transmitted electrons may also be fitted to this system so that scanning transmission electron (STEM) images may be obtained while operating the atom probe. Furthermore, electron diffraction patterns may be obtained readily from a sample in this orientation. There can be distortion in the diffraction pattern due to the nonuniformity of the field, but corrections can be made for these distortions. Diffraction pattern may also be obtained while the high field is off and no distortion would be present. For STEM imaging, it is possible to use accelerating voltages ($V_{gun}$) on the order of 100 kV to allow penetration of greater thicknesses of the sample. Distortions in the electron diffraction patterns are reduced as the voltage $V_{gun}$ increases. As the accelerating voltage of the electron optical system increases, the interaction volume decreases and smaller volumes may be heated. Greater mass resolution may also be realized by the higher cooling rate. In addition, an X-ray detector can be readily fitted to this system. Transmission electron microscopes and scanning transmission electron microscopes thus can be modified to accept an atom probe system in accordance with the present invention utilizing the instrumentation presently available in these instruments in conjunction with the atom probe.

Astigmatism may be introduced by the high fields in essentially all orientations of the electron optical column, except where the column is aligned to the axis 45 between the tip and detector. The astigmatism may be corrected for at any point in the image using standard correctors. However, the astigmatism will vary with position in the image. It is possible to use a dynamic astigmatism correction in a scanning image by setting astigmatism correction at several points in the image, or by having a function which describes the required correction and including circuitry which interpolates between positions and changes the setting as a function of position in the scan.

Pulsed heating may also be achieved by scanning the beam across the tip rather than by chopping the beam. If a 100 nanometer diameter beam is scanned across a 100 nanometer thick portion of a field emission tip in about $10^{-10}$ seconds, the probe travel speed needs to be approximately 2000 m/s. Such deflection speeds can be obtained with electromagnetic scan coils since it is not necessary to have constant deflection speed over large distances and nonlinearity in the scan can be tolerated. It is also possible to utilize electrostatic scan deflection plates which are faster than electromagnetic deflectors.

Significant energy can be deposited utilizing the technique of the present invention, generally providing about 1 keV per electron for 100 kV. Beam currents on the order of $2 \times 10^{-7}$ amps are satisfactory and can be adjusted depending on the size of the slit 58. An alternative tip excitation system for applying the desired thermal pulse to the tip may be obtained utilizing laser pulses. Photon beams have the advantage that they are not affected by the high electric field near the tip. However, the principal challenge for implementing photon beam thermal pulsing is focusing the beam down to a small spot. Lasers have historically been used to get the power density and short pulse duration needed for pulsed thermal evaporation.

Figure 7:
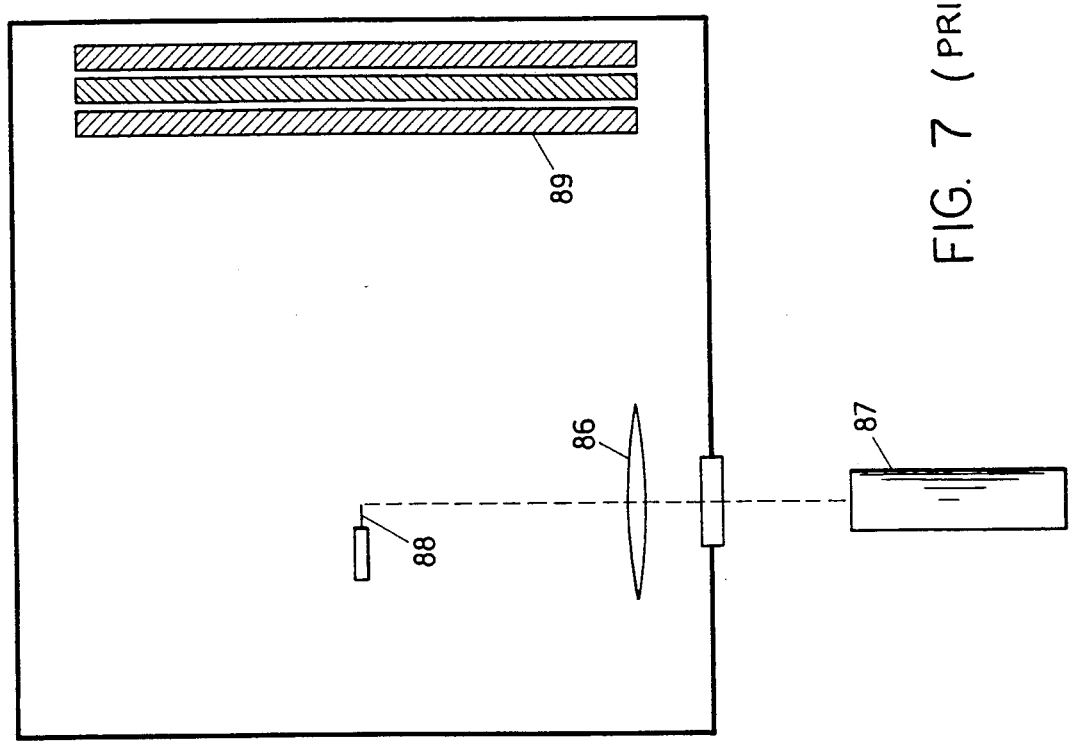
FIG. 7 is a schematic view of a prior art laser optical system having a refractive objective lens.

In general, when a laser beam has been used to illuminate a sample in an atom probe, a refracting lens system has been employed to focus the photons on the tip. A typical setup is illustrated in FIG. 7. Since the lens 86 focusing the beam from the laser 87 must, in general, be made of a non-conducting material, it must necessarily be placed away from the region of the tip 88 so that it will not interfere with the field distributions in the vicinity of the tip 88. Assume that the detector plane 89 is placed 150 mm from the tip 88. Then the lens should be placed on the order of 150 mm from the tip 88. Thus, the lens should have a focal length of this magnitude in order to bring parallel illumination to a focus.

Lasers typically produce a beam which is about 1 mm in diameter. This can be expanded to larger diameter by using a second lens to focus the light through an aperture. Thus, a spatially filtered beam emanates from the aperture as if it were a point source. The final lens may then be used at an appropriate location at which the beam diameter has expanded up to the limiting diameter of the lens.

Figure 9:
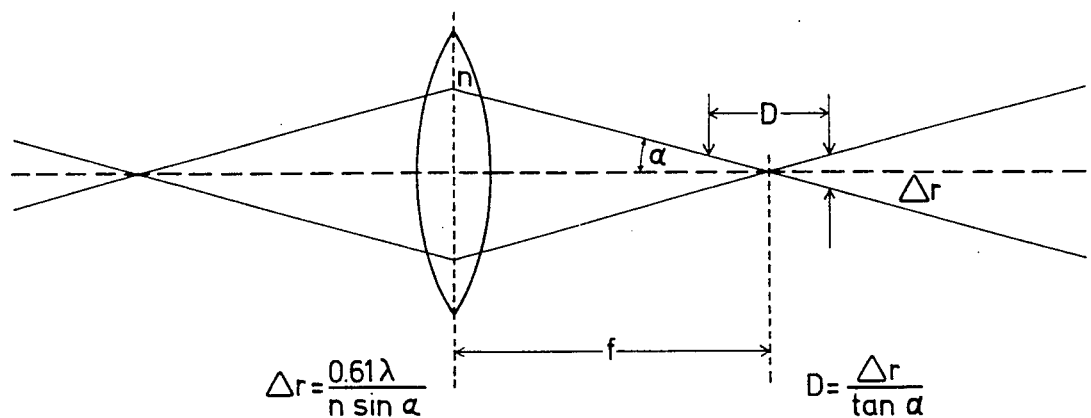
FIG. 9 is a schematic view illustrating the depth of field D and resolution $\Delta r$, as determined by the acceptance angle $\alpha$, in a laser optical system.

If the lens is optically perfect, then the smallest spot that may be produced will be limited by diffraction. As illustrated in FIG. 9, the $1/e^2$ spot size is given by:

$$\Delta r = \frac{0.61\lambda}{n\sin\alpha} \approx 1.27\lambda \frac{F}{\#}$$

where $\lambda$ is the wavelength of the light, $\Delta r$ is the diffraction limited resolution or spot size, and $F/\#$ is the size of the lens. The largest lens available in a refractor will be about $F/\#=1.5$, which means that the smallest spot possible with this lens will be about twice the wavelength if the lens is not limited by spherical aberration. If a practical beam size limit of 30 mm at a working distance of 150 mm is imposed by the need to pass the beam through a window in the vacuum system, then the spot size will be seven times the wavelength. However, glass lenses of this type cannot be made without significant spherical aberration and the spot will be significantly larger as a result. Generally, diffraction limited optics must use closer imaging distances.

For very high speed thermal pulsing by laser ($10^6$ pulses per second), the tip must be heated only in about the final 1 micron or less if fast heating and cooling are to be possible. For visible and infrared light with wavelengths on the order of 0.4 to 1.5 micron, this heated volume size will be difficult to achieve with refractor lenses illuminating from the side. Placing refractor lenses behind the tip is a possibility but the tip holder assembly will block the central part of the beam and cause optical aberrations. Thus, long focal length, low numerical aperture lenses will not be adequate for high speed pulsing.

Another limitation of refractor lenses is that they suffer chromatic aberration and they must be realigned or refocused when changing the source wavelength. Alignment stability is also a problem. Fiber optics do not have sufficient demagnification. Such lenses and fiber optics are limited to uv/visible/ir range and may result in unacceptable power absorption.

Figure 8:
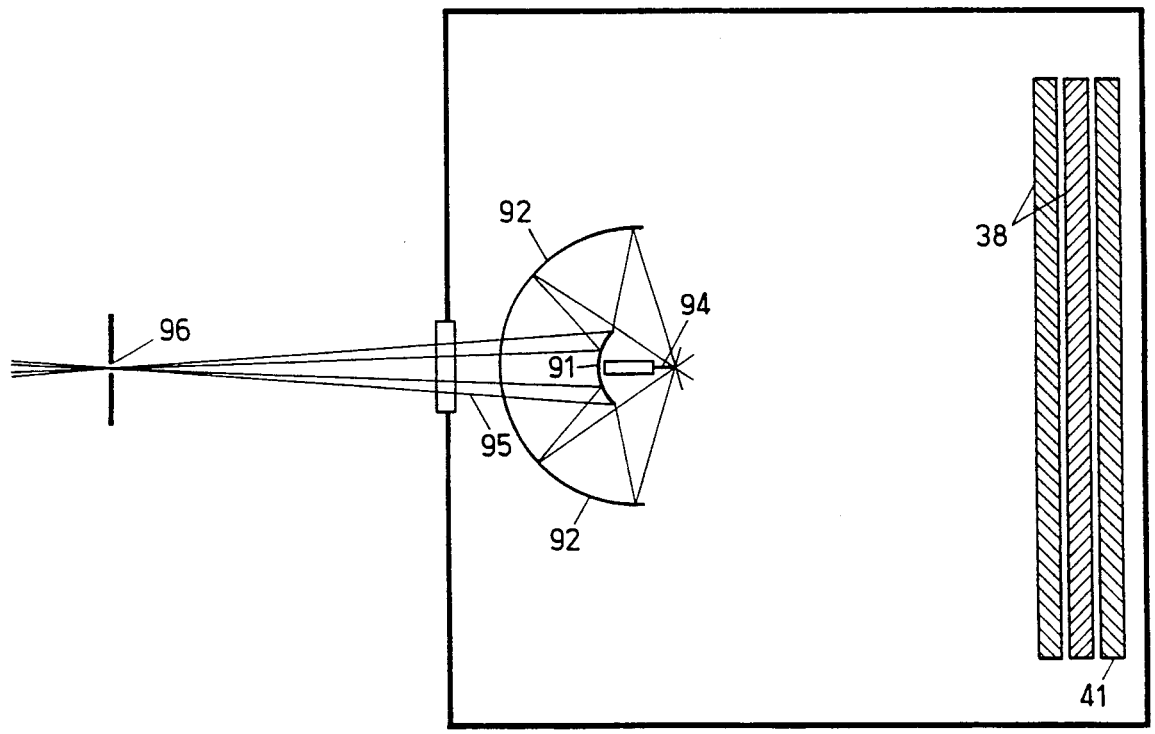
FIG. 8 is a schematic view of a pulsed laser optical system having a fully reflective Schwarzschild objective which may be used in the present invention.

The reflecting objective 90 illustrated in FIG. 8 is a simple optical device with only two surfaces 91 and 92, both of which are spherical. It provides an imaging system that is diffraction limited to high numerical apertures and has a long working distance. Because it employs only reflective surfaces, it is totally achromatic and can be used for a wide range of wavelengths from the ultraviolet through the infrared With suitable multilayer coatings on the reflective surfaces, the reflecting objective may be used with x-rays. This type of objective is conventionally referred to as a Schwarzschild objective. It has a convex spherical reflector 91 which reflects the incoming light to the concave spherical reflector 92 which focuses the light to a point at the tip 94. The reflector 92 has a central opening 95 through which the light from the aperture 96 passes.

The Schwarzschild objective offers many advantages for application in an atom probe. Because it is achromatic with no first order aberrations, this objective can be configured to operate at its diffraction limit for high numerical apertures. The numerical aperture that can be obtained for the Schwarzschild objective is about 0.3 to 0.5. This means that high intensity spots may be produced which are on the order of 1.2 times the wavelength of the light in diameter. For 800 nanometer light, a one micron spot may be produced.

Schwarzschild objectives also have the advantage that they are compact and may be placed near the object. The source may be placed a large distance from the objective. These objectives also provide a high demagnification of the order of 5 to 100 times. Thus, a 50 micron aperture outside the vacuum may be imaged to a diffraction limited spot. This objective may be configured with short focal lengths and thus high convergence angle, alpha. Since:

$$D = \frac{\Delta r}{\tan \alpha}$$

this configuration also leads to shallow depth of field, D. For a one micron spot, and taking alpha to be 30 degrees for a numerical aperture of 0.5, $D = 1.7$ micron. Thus, all of the intensity entering a reflecting objective will be focused to a volume on the order of one cubic micron.

By using a co-axial arrangement of the tip 94 and the lens 90, a simple geometry results as shown in FIG. 8. The photons in this arrangement impinge from all sides of the tip in an axially symmetric format. This promotes a higher heat transfer rate and more uniform heating of the tip. The alignment of this system is also simple. In a manner similar to that discussed above for pulsed electron beams, the desorption signal may be used as a measure of the heating of the tip during alignment. In this case, however, the lens would remain stationary and the tip would be moved in space until it enters the hot spot. The tip need only enter the hot spot partially so that a smaller volume of the tip may be heated. The light may be pulsed during the alignment. The Schwarzschild objective may also be used to form a back reflection image of the tip outside of the vacuum system. This can be used for precise alignment similar to that used in confocal microscopes where Schwarzschild objectives have also been employed.

Since the mirrors 91 and 92 may be made of metal such as polished aluminum or stainless steel, the Schwarzschild objective may be placed at the same potential as the tip if needed. This allows the mirrors to be placed very close to the tip assembly. These mirrors are also compatible with ultrahigh vacuum operation.

Since the Schwarzschild objective is achromatic, it will work for any wavelength of x-ray/uv/visible/ir light without realignment. This makes it possible to change sources by simply focusing a new source on the aperture outside the vacuum system. By changing photon wavelength and by mixing photon beams of different wavelength, it is possible to better match the optimal absorption wavelengths of the tip material. Some lasers can be operated in a wavelength doubling mode and these lasers would not even need to be realigned. Furthermore, the Schwarzschild objective can be used to focus white light so that non-laser pulsed sources, as a strobe lamp, could be utilized. White light will, however, have a spot size which is a superimposition of the diffraction limited spot size from each wavelength.

There are no good refracting lenses for infrared light, yet many solid state and free electron lasers emit in the infrared. Furthermore, synchrotron sources emit pulses of photons at high repetition rates in the extended ultraviolet and x-ray. There are no lenses available for these photon energies and the Schwarzschild objective is the best optical element for producing focussed beams of these photons. The Schwarzschild objective is amenable to a wide variety of photon sources and can be adapted readily to almost any pulsing scheme.

To obtain high thermal pulsing speed and good mass resolution, it is desirable to use photon pulses which are on the order of 1 nanosecond in length. The only lasers which now are available to produce these short pulses at high repetition rates are mode locked, synchronous pumped cavity lasers. These systems have 300 picosecond pulse widths with a variable repetition rate from 1 kHz to 4 MHz. Synchrotrons and free electron lasers produce pulses in the 1 to 5 nanosecond range at repetition rates of 1 to 50 MHz. These sources can be employed for high speed thermal pulsing when used in conjunction with a Schwarzschild objective.

$10^{-13}$ to $10^{-7}$J in $10^{-10}$ second is required for adequate tip heating. Even at $10^{-3}$ for an absorption efficiency, $10^{-7}$J per pulse is commonly available from these lasers.

Multiple lasers can also be used in different energy ranges to obtain better absorption.

The tip can be mounted on piezo drive or differential screw to allow positioning of the tip. The tip can be scanned and the signal used to image. The same scheme as described above is used to locate the optimal position of the tip relative to the pulsing photon beam.

Pulsed electron beam heating and pulsed photon beam heating of the field emission tip are approaches which are not mutually exclusive. For some applications, it may be desirable to have both thermal pulsing systems on a single instrument. Either system could also stand alone as the only thermal pulsing system.

Furthermore, since the pulsed electron beam system utilizes electron optics which are similar to those which exist on common transmission electron microscopes, scanning electron microscopes, scanning transmission electron microscopes, electron microprobes, scanning Auger microprobes, and similar instruments of this nature, it is possible to configure the atom probe of the present invention to allow it to readily attach to existing instruments and use the existing electron optics for pulsed heating and imaging.

The detection process may be divided into several parts: a) charge amplification by the microchannel plate (MCP), b) charge collection by the anode, c) charge integration by the first stage detector electronics, d) charge conversion to digitized form, and e) conversion of digitized data to position information. In designing a detector which operates at high speed, any of these parts could be rate limiting and must be considered.

Figure 10:
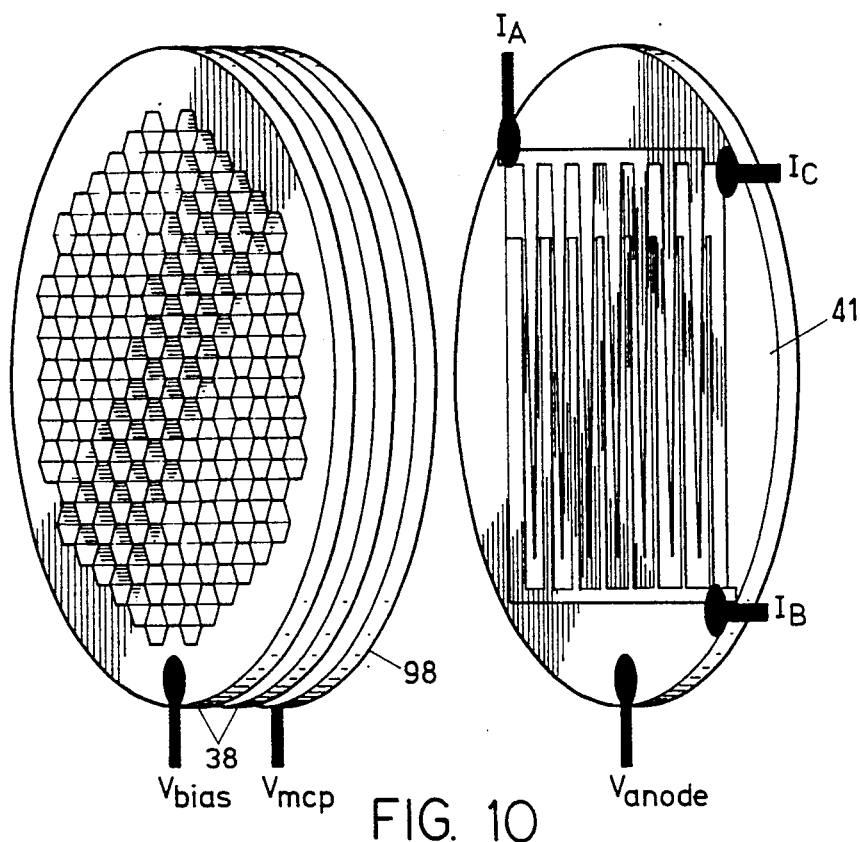
FIG. 10 is an illustrative perspective view of position sensitive detector formed of a stack of microchannel plates and a wedge and strip detector anode.

The basic design of the position sensitive detector (PSD) is shown in schematic form in FIG. 5 and in a more detailed perspective view in FIG. 10. The assembly consists of a tandem pair of MCP's 38, mounted in chevron configuration about 100 to 150 millimeters from the specimen tip. A third single MCP may be placed a few millimeters away to achieve a final amplification in the range of $10^6$ to $10^9$. The MCP stack can be curved with a radius equal to the distance from the tip so that all atoms have an equal flight distance. Alternatively, a flat MCP can be used and the differences in flight path length are taken into account. A flat MCP has the advantage that the tip-to-MCP distance ma be changed in order to change image magnification, and allows a simpler correction for flight path length.

The wedge-and-strip anode (WSA) detector 41 shown in FIG. 6 has been used by investigators at Oxford University on a field-pulsed POSAP as the key element of the position sensitive detector. The wedge-and-strip anode 41, which provides the position sensing, is mounted at an appropriate distance (on the order of a few millimeters) behind the MCP stack to match the electrode spacing to the size of the incident charge cloud to minimize distortion in the image. The properties of wedge-and-strip anodes have been described by Martin et al., Rev. Sci. Instrum. 52, (1981), pp. 1067 et seq. These anodes are relatively easy to fabricate and exhibit little geometric distortion and high spatial resolution. For MCP outputs in the range of $10^6$–$10^7$ electrons, amplifier noise is less than $10^3$ electrons and images of $10^5$–$10^7$ pixels can be obtained. A resolution of better than 50 microns at a gain of $3 \times 10^6$ has been measured by Martin et al., id. This yields $500 \times 500$ pixels for a 25 mm MCP. The wedge-and-strip anode is a particularly simple coplanar three-electrode pattern as shown in FIG. 6. In this configuration, charge signals are collected from the A, B, and C electrodes and are digitized. The X and Y position of impact of the incident ion for this electrode can be calculated by the formulas given above.

To use this anode in a system which operates at $10^6$ pulses per second, the electron charge must first be drained off each electrode and then separate circuits must determine the amount of charge collected by each electrode using a charge integration system. The time that it takes for the charge to drain off each electrode is on the order of one to ten nanoseconds. This drainoff time is determined primarily by the time required for electrons to flow along the metal wires to the charge integrator. In a low speed system, it is possible to have the charge integrators in separate instrument modules outside the vacuum system without affecting the overall speed of the system. The charge integrator systems themselves are commercial components which have on the order of 60 microsecond cycle times with 2 microsecond reset times on a null detect. By pulsing so that one atom evaporates per fifty pulses and using a reset signal on each null detect, these commercial charge integrators can be used with 160 microsecond average cycle time. This speed corresponds to about 6000 atoms detected per second and $3 \times 10^5$ pulses per second.

The speed of the wedge-and-strip anode is not a limiting factor. Faster charge integration can be accomplished by using high speed, low bias FET's or FET op-amps. Current technology in FET amplifiers allows settling times of 20 to 100 nanoseconds and reset times of 100 nanoseconds to 1.5 microseconds. If necessary, a charge transfer stage can be introduced ahead of the charge integration stage to further speed up the pipeline. The signal from the charge integrator can then be read out directly or stored intermediately in a sample-and-hold amplifier. The signal is then digitized using a flash analog-to-digital (A-to-D) converter 79. Commercially available flash A-to-D converters provide 12-bit-resolution conversions at 2 to 20 MHz rates. It is this digitized signal for each of the 3 WSA collectors that is read and stored for each event by a computer workstation. The time of flight (TOF) signal is digitized by using the pulse as a start signal, the discharge of the MCP as a stop signal, and a high-speed counter as a tachometer to determine TOF to within 1 nanosecond or better.

To minimize the charge transfer time and noise pickup, these electronics are preferably located on the wafer which is used for fabrication of the wedge and strip anode. With this design, the detector system may have a 1 microsecond cycle time, which means that $10^6$ pulses per second can be made and $10^6$ atoms per second would be detected. Operating at 1 event per 50 pulses so that a negligible number of multiple events occur, $2 \times 10^4$ atoms per second would be detected. If higher error rates are acceptable, then higher evaporation rates could be used with a corresponding increase in the number of atoms per second detected.

The requirements for maximum resolution is that $2r \leq p$, where r is the radius of the charge cloud whose centroid we wish to measure and p is the pitch of the wedge-and-strip anode pattern. Martin, et al., suora. If the cloud has a size which is approximately 100 microns, then the detector pitch must be less than 200 microns so that each element must be less than 100 microns in size. If we wish to require that the dead area be less than 2% of the detector, then the width of the space between collectors must be less than 2 microns.

While current spatial and electron beam lithographies may allow this value using reduction step-and-repeat systems, the optical tolerance is on the pitch and spacing over the entire field of the device. It is preferable that a full field exposure be made over the 120 cm diameter of the detector. This can be accomplished by taking advantage of the fact that the pattern of the WSA has a single constant thickness separation line between the elements. Thus, if a fullfield exposure can be made for a thicker line, for example, 5 microns, then this feature can be biased during the process by increasing the exposure through a mesh of 5 micron thick lines and increasing development times. By this approach, less than 2 micron line widths may be achieved in processing the relative areas and positions of all the elements.

Since such a process may be more difficult for manufacturing than processing without biasing, this method can be used to make a master mask with less than 2 micron line width for use in contact or proximity printing. If the mask is compatible with deep ultraviolet sources, a bi-level resist and contact printing will suffice. However, if the mask is compatible with X-ray sources, then proximity X-ray lithography can be used in full-field exposure to accurately replicate less than 2 micron lines with less than 0.1 micron error.

One source of concern in utilization of a WSA with 2 micron gaps is the capacitance of the device. A high capacitance will increase the drain-off time of the electrodes and careful consideration of the trade-offs between precision and speed must be made.

If a charge integration process will require at least 1 microsecond to complete, then detectors based upon this principal can only be speeded up by detecting more than one event per pulse. The evaporation rate is controlled by adjusting the amount of power in the thermal pulse and therefore the temperature of the tip during the thermal spike. When one atom per pulse only may be detected, and proper operation requires a negligible data loss due to simultaneous events, then the probability of two atoms per pulse must be adjusted to be what is considered negligible. This probability will be taken here to be $10^{-4}$. From experience in operation of an atom probe, at this evaporation rate, one atom is evaporated about every fifty pulses. The probability of one atom per pulse is therefore $2 \times 10^2$.

If the detector system can be made to detect two atoms in a given pulse, then errors are introduced only when three atoms evaporate in a given pulse. Thus, if we take the probability of three atoms per pulse to be negligible, e.g., $10^{-4}$, then the probability of two and one atoms per pulse would be considerably greater. Thus, an order of magnitude increase in the number of atoms detected per unit time is available if two events per pulse are detected.

There are three basic approaches to position-sensitive detection. In one approach, collector wires are arranged with regular spacing along each of one or two directions for a one- or two-dimensional detector, respectively. The result is simply determined as a hit or not, and this type is therefore referred to as a binary detector scheme. The spatial resolution of this type of detector is simply that of the spacing of the wires. If two or more wires are hit, then the middle of the collection of hit wires can be taken as the position. One advantage of this detector is that it can operate at very high speed (on the order of several nanoseconds readout time).

The second basic approach uses separation of charge onto a geometric array of electrodes as a means of determining the centroid of the charge cloud. For example, in the wedge-and-strip detector, three electrodes in one layer are used to determine the two-dimensional position of the centroid of a charge cloud. The advantage of this approach is that the position may be determined with high accuracy (5% of the pitch). The price that must be paid for this accuracy is the time required to perform the charge integration.

Figure 13:
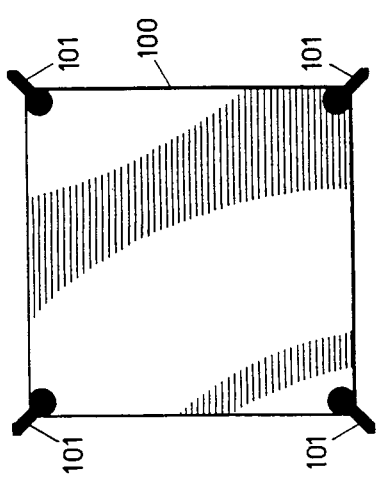
FIG. 13 is an illustrative view of a detector anode formed of a resistive plate.

The third approach uses separation of charge according to the arrival position along a resistive wire. In a one-dimensional case, if a charge cloud hits a resistive wire at two thirds of the distance between points A and B, then two thirds of the charge will drain into the connector at B and one third will drain into A. This detector is very simple but is not fast. Because the wire has a high resistivity, the charge will drain off slowly. Furthermore, once the charge is drained, charge integration must be performed on the two signals. A two dimensional resistive plate 100 having charge collectors 101 which can provide two dimensional information is shown in FIG. 13.

The most stringent case for detection of simultaneous events is two atoms of the same mass-to-charge ratio in nearest neighbor sites which evaporate at the same time. We shall assume that the microchannel plates are arranged to produce charge clouds which do not significantly overlap at the anode for this case. The magnification of the image on the microchannel plates, the amount of spreading of the charge clouds in progressing through the MCP's, and the amount of spreading of the charge clouds between the MCP's and the anode all influence the overlap of proximal-event charge clouds and should be adjusted to optimize for a given design.

A detector which is a hybrid of the two approaches to position-sensitive detection is a grid of perpendicular wires (or metal electrodes on an insulating substrate) used to get the fast position detection. By also performing a charge separation on the respective X and Y electrodes, a precise position may subsequently be determined. If two events arrive at the detector within one pulse cycle then it becomes necessary to distinguish between the pair of events depicted by the circles versus the x's in FIG. 11. The two events might be distinguished their arrival times if their arrival times were separated by more than the time required for readout of one event on the detector. However, if a pair of events arrives at the detector at the same time, i.e., they have the same mass-to-change ratio, then there is no information which can be used to distinguish between the circles and the x's.

Figure 12:
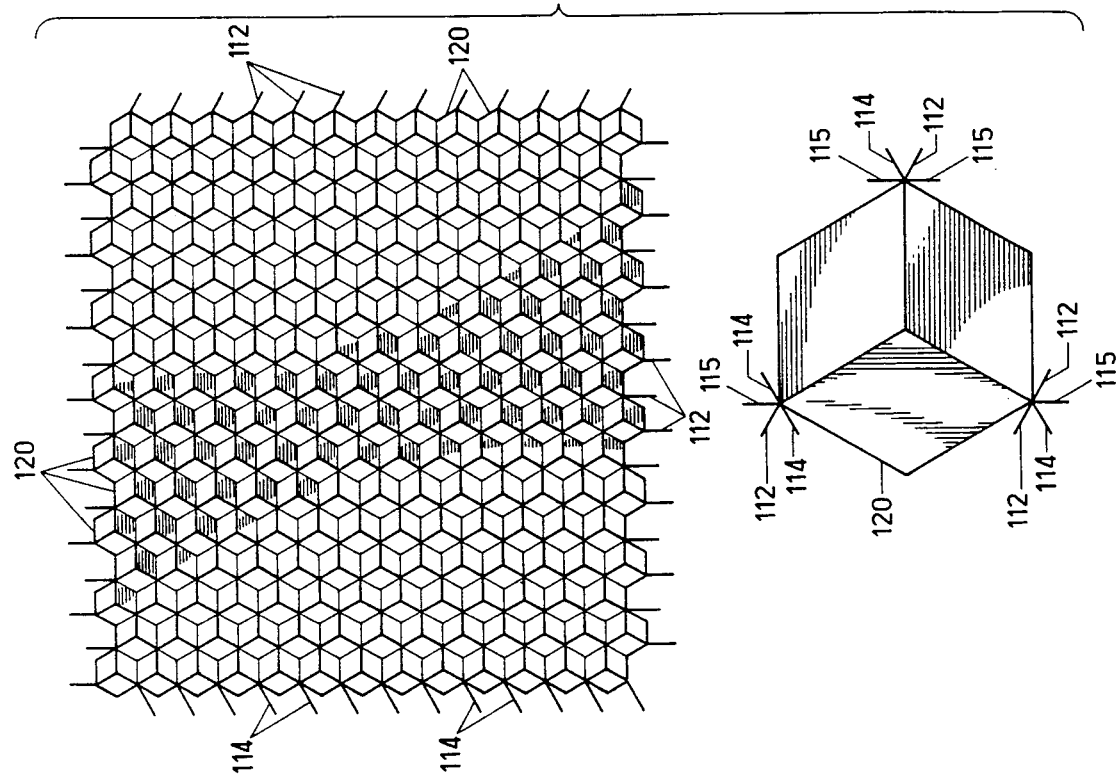
FIG. 12 is an illustrative view of a detector anode composed of a trigonal array of pads.
Figure 12:
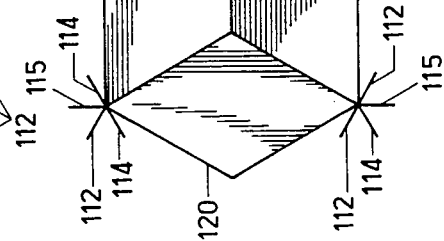
Figure 11:
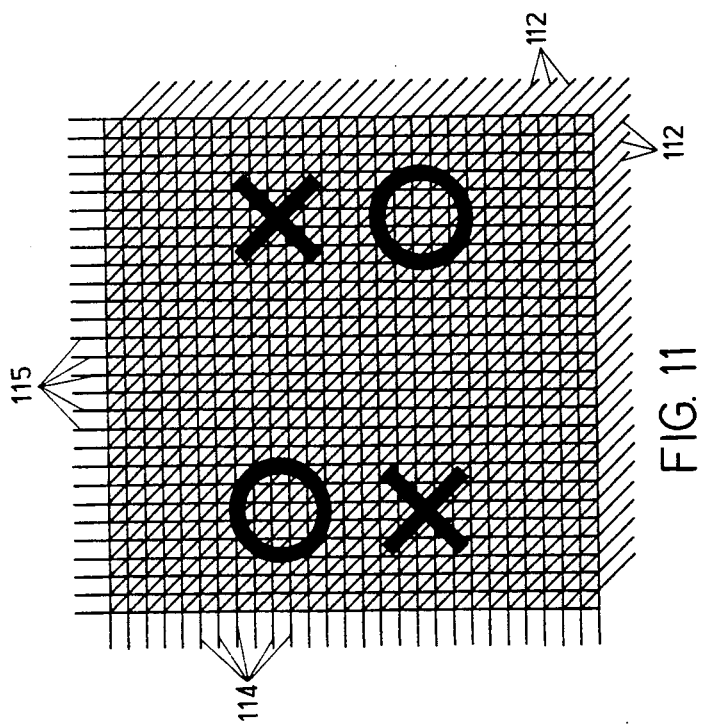
FIG. 11 is an illustrative view of a grid detector composed of three interpenetrating sets of wires or pads.

For this reason, a third set of wires 112 (or electrodes) is added to the basic design of a grid of wires 114 and 115, as illustrated in FIG. 11. Now, the circles and x's may be readily distinguished. This design may be generalized by making each set of lines equivalent, obtaining the three-level, trigonal array of pads 120 illustrated in FIG. 12. The position of the centroid of each charge cloud would be over-determined but that extra information is used to determine which timing signal corresponds to which event. Multiple timing signals may be distinguishable by the timing of the readout signals on the trigonal detector if the events are separated adequately in time. The trigonal detector is fabricated of thin metal films (for example 1 electrically insulating substrate (for example, amorphous silicon dioxide or 1 micron thick silicon dioxide on silico). The diamond shaped metal thin films of each electrode are located in one layer and electrically isolated initially. The continuous electrodes 112, 114, and 115 are then connected by additional masked depositions of metal connectors followed by insulating layer. Alternatively, the connections can be fabricated subsurface and only the diamond shapes would be exposed.

Figure 14:
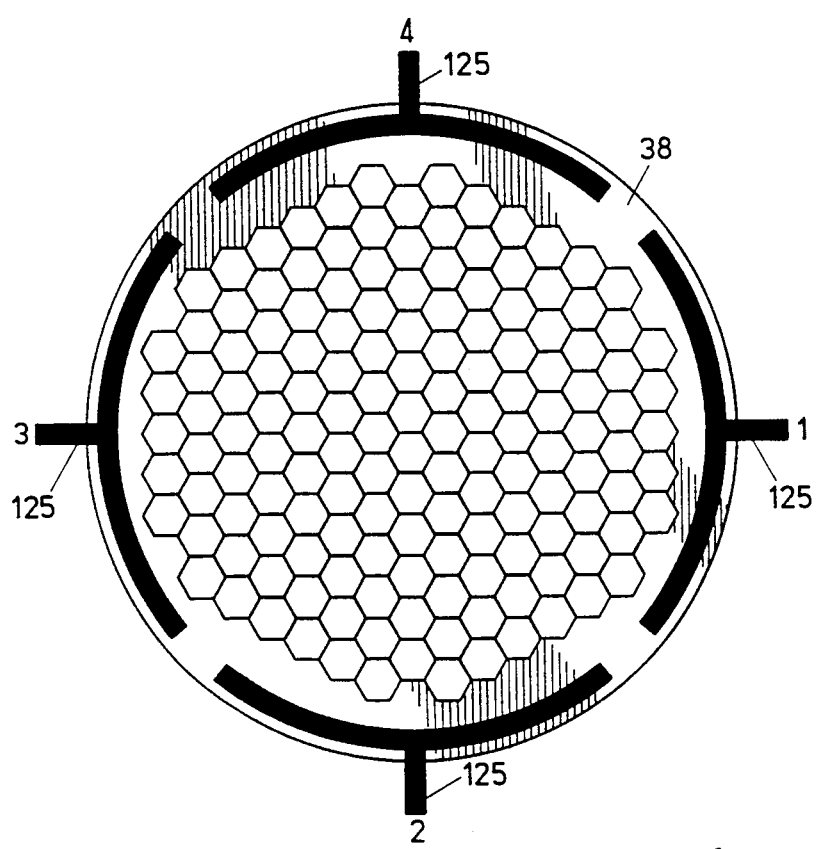
FIG. 14 is an illustrative view of a microchannel plate used for pulse amplification, modified for time of flight measurements with position sensitivity based on a 4-point resistive anode geometry.

In addition, spatial and timing information may be obtained from the microchannel plate assembly. Essentially, four electrodes 125 are attached on the periphery of the microchannel plate 38, as illustrated in FIG. 14 and the relative amounts of charge supplied by each electrode on a given pulse can be used as an approximate measure of the position of the event on the MCP 38. These electrodes are preferably formed as part of the mounting hardware for the MCP.

Like the high speed WSA, detection of the charge on each wire or line of detectors in the trigonal array must be accomplished in less than 1 microsecond using current high speed FET's. This requires the efficient conversion and reading of 300 signals (100 signal lines in each of three directions) in 1 microsecond as opposed to 3 signals per microsecond for the WSA. To minimize the number of data transfers and data storage for each event, it is first observed that 5 lines times 3 directions = 15 detectors may have charge on them for each atom detected. For a maximum of 2 atoms at a time, that is about 30 of the 300 detectors. To reduce space and noise requirements, the charge integrators for each line can be incorporated on the detector. The output of the integrating amplifiers is sampled and held, then transferred at high speed locally to a comparator. When any signal is detected above a minimum threshold, the value is digitized and is transferred to the computer with the position of the wire associated with the signal. The computer then reconstructs the position of the charge cloud centroids from an array of 15 to 30 integrated charge levels and positions.

If the speed available from a high speed position-sensitive detector reaches about $10^6$ pulses per second, then field ion microscopy (FIM) images can be displayed in real time from these data. For example, if we assume that there are $10^4$ atoms per image plane in a FIM image, and we want a signal-to-noise ratio of 10%, $10^2$ events per point are needed. Thus, at $10^6$ events per second one FIM image of this quality can be recorded in one second. By integrating the signal for longer times, improvements in the signal-to-noise ratio are achieved. Such images are often used to assess the quality of a field emission sample prior to atom probe work. The electronically recorded images can be stored and replayed onto any form of display or recording device including photographic film. Doing so makes it unnecessary to provide a fluorescent screen and microchannel plate assembly in the atom probe.

It is understood that the invention is not limited to the particular embodiments described herein, but embraces such modified forms thereof as come within the scope of the following claims.

What is claimed is:

1. Position sensitive atom probe apparatus comprising:
   (a) an emission tip adapted to have atoms evaporated from the surface of the tip;
   (b) a position sensitive detector mounted to receive charge from atomic emission events at the emission tip and providing a signal indicative of the position and time of incidence of a charge cloud thereon resulting from an atomic emission event at the emission tip;
   (c) an electron beam column mounted to provide a pulsed beam of electrons to the emission tip and having an electron gun providing a beam of electrons, an aperture plate with a slit therein, means for focusing the electron beam from the electron gun onto the aperture plate and deflecting the beam back and forth across the slit to provide pulses of electrons passed through the slit, means for focusing the electrons passed through the slit and directing them to the emission tip to heat the tip in pulses as the electron beam is scanned across the slit of the aperture plate.

2. The atom probe apparatus or claim 1 including means for applying a high electrical potential difference between the emission tip and the position sensitive detector.

3. The atom probe apparatus of claim 1 wherein the electron beam column is disposed at 90° to the tip so that the pulses of electrons contact the tip from the side.

4. The atom probe apparatus of claim 1 wherein the position sensitive detector comprises a microchannel plate and a position sensitive anode mounted behind the microchannel plate.

5. The atom probe apparatus of claim 4 wherein the position sensitive anode is a wedge and strip detector.

6. The atom probe apparatus of claim 4 wherein the detector includes a second microchannel plate mounted between the microchannel plate and the position sensitive detector.

7. The atom probe apparatus of claim 1 wherein the means for focusing electrons from the gun onto the aperture plate and deflecting the beam across the slit in the plate comprises a condenser lens and deflector plates mounted on either side of the beam from the electron gun, and wherein the means for focusing the electrons passed through the slit includes a condenser lens, scanning deflector plates, and stigmators.

8. Position sensitive atom probe apparatus comprising:
   (a) an emission tip adapted to have atoms evaporated from the surface of the tip;
   (b) a position sensitive detector mounted to receive charge from atomic emission events at the emission tip and providing a signal indicative of the position and time of incidence of a charge cloud thereon resulting from an atomic emission event at the emission tip;
   (c) an electron beam column including an electron gun for providing a beam of electrons and means for focusing the beam and deflecting the beam rapidly back and forth so that the beam hits the tip in short pulses during each traverse of the beam to provide pulse heating of the emission tip.

9. The atom probe apparatus or claim 8 including means for applying a high electrical potential difference between the emission tip and the position sensitive detector.

10. The atom probe apparatus of claim 8 wherein the electron beam column is disposed at 90° to the tip so that the pulses of electrons contact the tip from the side.

11. The atom probe apparatus of claim 8 wherein the position sensitive detector comprises a microchannel plate and a position sensitive anode mounted behind the microchannel plate.

12. The atom probe apparatus of claim 8 wherein the position sensitive anode is a wedge and strip detector.

13. The atom probe apparatus of claim 8 wherein the detector includes a second microchannel plate mounted between the microchannel plate and the position sensitive detector.

14. Position sensitive atom probe apparatus comprising:
   (a) an emission tip adapted to have atoms evaporated from the surface of the tip;
   (b) a position sensitive detector mounted to receive charge from atomic emission events at the emission tip and providing a signal indicative of the position and time of incidence of a charge cloud thereon resulting from an atomic emission event at the emission tip;
   (c) source means for providing an intense beam of electromagnetic radiation in selected short duration pulses;

(d) a Schwarzschild objective having a convex spherical reflector and a concave spherical reflector with an open central portion, the two reflectors arranged to receive the beam from the source means and focus the beam onto the tip.

15. The atom probe apparatus of claim 14 including means for applying a high electrical potential difference between the emission tip and the position sensitive detector.

16. The atom probe apparatus of claim 14 wherein the Schwarzschild objective and source means are disposed behind the tip so that the beam contacts the tip from all sides.

17. The atom probe apparatus of claim 14 wherein the position sensitive detector comprises a microchannel plate and a position sensitive anode mounted behind the microchannel plate.

18. The atom probe apparatus of claim 14 wherein the position sensitive anode is a wedge and strip detector.

19. The atom probe apparatus of claim 14 wherein the source means comprises a laser.

20. A method of pulse heating an emission tip of an atom probe comprising the steps of:
 (a) producing a beam of electrons;
 (b) deflecting the beam rapidly back and forth across the emission tip to heat the tip in a pulsed fashion as the electron beam is incident upon the tip.

21. The method of claim 20 including the further steps of (i) detecting atomic emission events occurring as the electron beam is incident upon the tip in an image detector; (ii) rastering the electron beam over an area which includes the emission tip and forming an image on the image detector of the emission tip as the electron beam is incident upon it, and (iii) changing the deflection of the electron beam in the raster until the center of the raster is located substantially at the emission tip, and then proceeding with steps (a) through (b) with the electron beam traversing back and forth at that portion of the raster scan which passes through the emission tip.

22. A method of pulse heating an emission tip of an atom probe comprising the steps of:
 (a) producing a beam of electrons;
 (b) focusing the electron beam and scanning the beam back and forth across an aperture in an aperture plate, wherein the aperture is formed as a slit of smaller width than the diameter of the beam so that pulses of electrons are passed through the slit for each scan of the beam across the slit;
 (c) focusing the electrons passed through the slit and directing the electrons onto the emission tip.

23. The method of claim 22 wherein the slit in the aperture plate has a width of approximately 1 micron.

24. The method of claim 22 including, before steps (a) through (c), the additional steps of focusing the electron beam on the slit to pass the beam through the slit continuously and scanning the beam passed through the slit in a raster across the area occupied by the emission tip, forming an image of the emission tip when the electrons in the beam are incident on the tip, redirecting the raster of the electron beam until the tip is at substantially the center of the raster, and then performing steps (a) through (c) with the electrons passing through the slit being focused and directed to be incident upon the tip.

* * * * *

UNITED STATES PATENT AND TRADEMARK OFFICE
CERTIFICATE OF CORRECTION

PATENT NO. : 5,061,850

DATED : October 29, 1991

INVENTOR(S) : Kelly, Thomas F.; McCarthy, Jon J.; Mancini, Derrick C.

It is certified that error appears in the above-identified patent and that said Letters Patent is hereby corrected as shown below:

Column 7, line 12, "$10^{317}$" should be --$10^{-7}$--.

Column 8, line 68, "$10^{6-10^7}$" should be --$10^6$-$10^7$--.

Column 9, line 1, "$10^{5-10^7}$" should be --$10^5$-$10^7$--.

Column 13, line 15, "infrared" should be --infrared.--.

Column 14, line 47, "$10^{-7}$" should be --$10^{-10}$--.

Column 15, line 26, "ma" should be --may--.

Column 16, line 41, "$2r \leq p$," should be --$2r \geq p$,--.

Column 16, line 43, "suora." should be --supra.--.

Column 17, line 26, "$10^2$." should be --$10^{-2}$.--.

Column 18, line 46, after "example 1" add -- micron thick gold on 20 nm thick chromium) on an--.

Signed and Sealed this

Fourth Day of May, 1993

Attest:

MICHAEL K. KIRK

Attesting Officer

Acting Commissioner of Patents and Trademarks